United States Patent
Nair et al.

(10) Patent No.: US 7,254,795 B2
(45) Date of Patent: *Aug. 7, 2007

(54) TIMING CONVERGENCE, EFFICIENT ALGORITHM TO AUTOMATE SWAPPING OF STANDARD DEVICES WITH LOW THRESHOLD-VOLTAGE DEVICES

(75) Inventors: Umesh Nair, Newark, CA (US); Toshinari Takayanagi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 21 days.

This patent is subject to a terminal disclaimer.

(21) Appl. No.: 11/152,929

(22) Filed: Jun. 15, 2005

(65) Prior Publication Data

US 2006/0031799 A1    Feb. 9, 2006

Related U.S. Application Data

(63) Continuation of application No. 10/600,740, filed on Jun. 20, 2003, now Pat. No. 6,910,197.

(51) Int. Cl.
*G06F 17/50* (2006.01)

(52) U.S. Cl. .................. 716/6; 716/2; 716/10

(58) Field of Classification Search ............ 716/2, 716/6, 10
See application file for complete search history.

(56) References Cited

U.S. PATENT DOCUMENTS

| | | | |
|---|---|---|---|
| 5,623,608 A | 4/1997 | Ng .................... | 395/250 |
| 5,774,367 A * | 6/1998 | Reyes et al. ......... | 716/2 |
| 5,958,027 A | 9/1999 | Gulick ............... | 710/52 |
| 6,392,747 B1 | 5/2002 | Allen et al. ......... | 356/141.1 |
| 6,493,856 B2 * | 12/2002 | Usami et al. ........ | 716/10 |
| 6,550,045 B1 | 4/2003 | Lu et al. ............ | 716/6 |
| 6,813,750 B2 * | 11/2004 | Usami et al. ........ | 716/4 |
| 2002/0099989 A1 * | 7/2002 | Kawabe et al. ...... | 714/724 |
| 2003/0188268 A1 * | 10/2003 | Konstadinidis et al. .. | 716/2 |
| 2004/0123261 A1 * | 6/2004 | Alpert et al. ........ | 716/13 |

* cited by examiner

*Primary Examiner*—Jack Chiang
*Assistant Examiner*—Magid Y. Dimyan
(74) *Attorney, Agent, or Firm*—Dorsey & Whitney LLP (57) ABSTRACT

A method for optimizing low threshold-voltage ($V_t$) devices in an integrated circuit design. The method includes identifying paths and nodes within the integrated circuit design, determining node overlap within the integrated circuit design, calculating possible solutions for addressing timing violations within the integrated circuit design, choosing a solution for addressing timing violations, inserting low $V_t$ devices at particular nodes of the integrated circuit design, and repeating the calculated possible solutions wherein choosing a solution and inserting low $V_t$ devices at particular nodes to address timing violations within the integrated circuit design.

24 Claims, 7 Drawing Sheets

|        | A | B | C | D | E | F |
|--------|---|---|---|---|---|---|
| Path 1 | X | X |   | X |   | X |
| Path 2 | X | X | X |   |   | X |

Figure 3

|        | A | B | C | D | E | F |
|--------|---|---|---|---|---|---|
| Path 1 | X |   |   | X |   |   |
| Path 2 | X | X | X |   | X | X |

Figure 4

|        | A | B | C | D | E | F |
|--------|---|---|---|---|---|---|
| Path 1 | X |   |   | X |   | X |
| Path 2 | X | X | X |   | X |   |
| Path 3 | X |   | X |   |   | X |

TIMING CONVERGENCE, EFFICIENT ALGORITHM TO AUTOMATE SWAPPING OF STANDARD DEVICES WITH LOW THRESHOLD-VOLTAGE DEVICES

CROSS-REFERENCE TO RELATED APPLICATIONS

This application is a continuation of application No. 10/600,740, filed Jun. 20, 2003, now U.S. Pat. No. 6,910,197, entitled "System for Optimizing Buffers in Integrated Circuit Design Timing Fixes" naming Umesh Nair as inventor, which is hereby incorporated by reference in its entirety.

BACKGROUND OF THE INVENTION

The present invention relates to the field of integrated circuits and more particularly to low-threshold-voltage devices used for improving the characteristics of timing paths within an integrated circuit chip.

Known integrated circuit chips contain a large number of transistors and interconnections. Given the large number of these devices, combined with ever-increasing chip operating frequency, fullchip timing analysis and timing convergence is a challenge when designing the integrated circuit chip. This design issue becomes even more challenging because every incremental change to the integrated circuit design affects both maximum timing (often referred to as maxtiming) and minimum timing paths.

Figure 1A:
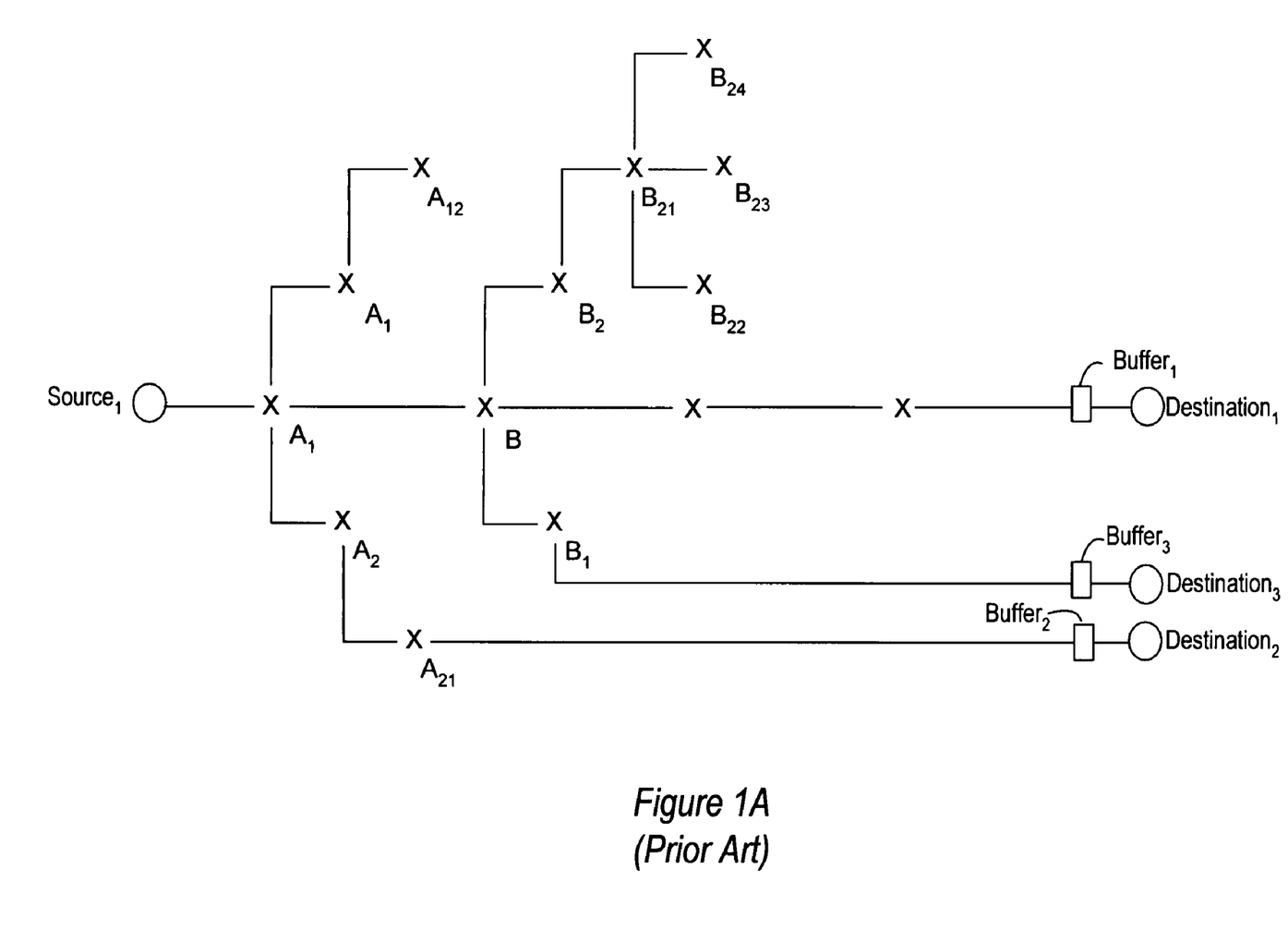
FIG. 1A, labeled prior art, shows an example of an integrated circuit design including buffers for addressing timing failures.

For example, FIG. 1A, labeled prior art, shows a simplified example of some of the issues relating to inserting buffers into an integrated circuit design to address minimum timing issues. More specifically, an integrated circuit design includes a plurality of sources (e.g., source 1), a plurality of destinations, (e.g., destination 1, destination 2 and destination 3). Between the sources and destinations are a plurality of nodes (designated by "x") as well as a plurality of paths between the sources and the nodes, between the nodes and other nodes and between the nodes and the destinations. With an actual integrated circuit design there are many sources and destinations and massive numbers of nodes and paths.

Each of the nodes includes an associated time slot. A time slot is a continuously repeating interval of time in which two nodes are able to communicate. When the timing at a particular node is either too fast (i.e., a signal arrives at a node before the node's time slot) or too slow (i.e., a signal arrives at a node after the node's time slot), then the node is said to have either a maximum time failure or a minimum time failure, respectively.

Figure 1B:
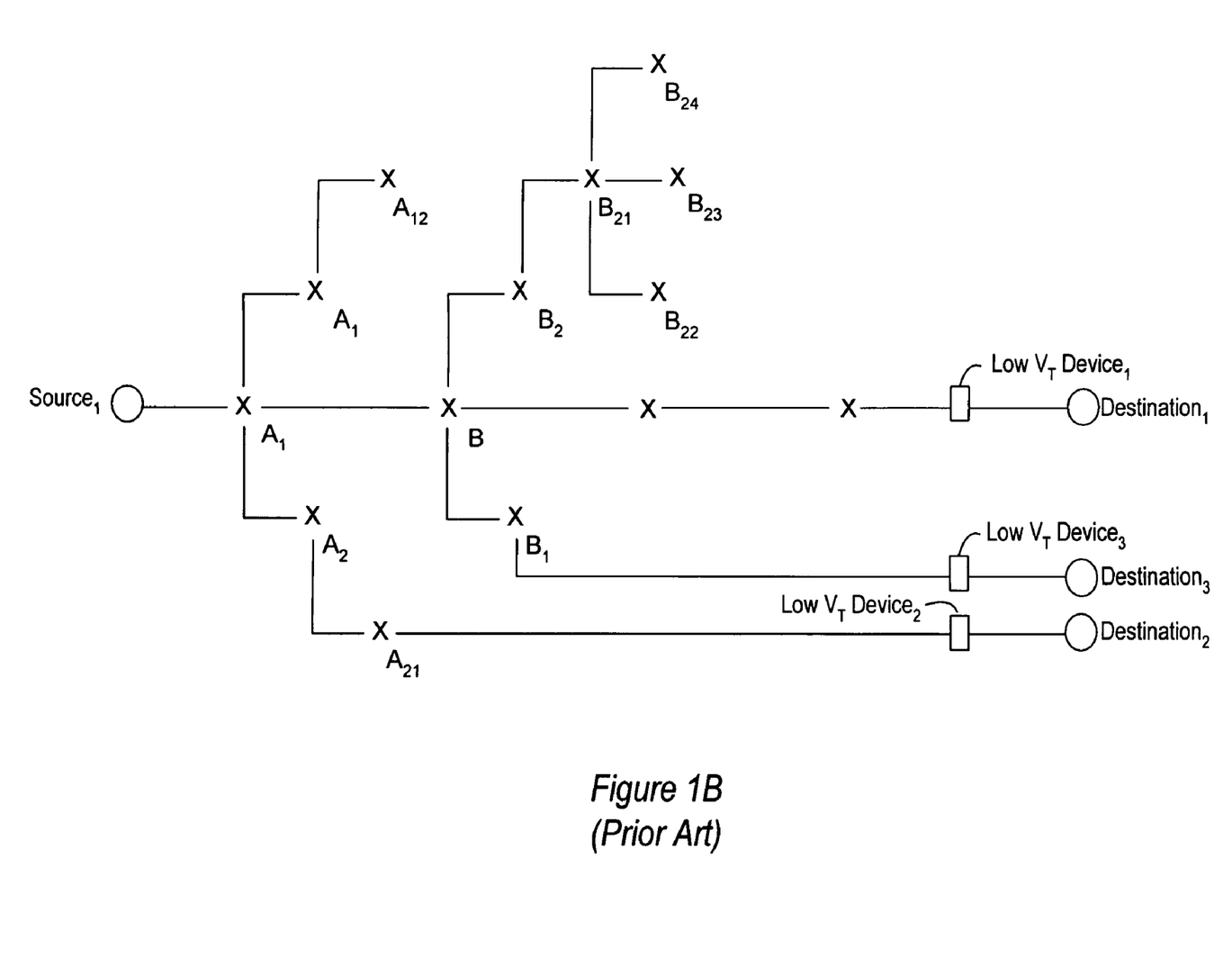
FIG. 1B, labeled prior art, shows an example of an integrated circuit design including low $V_t$ devices for addressing timing failures.

In known systems, buffers (e.g., buffer 1) are placed close to each of the destinations within the integrated circuit to address the minimum time failures for that particular destination. In some cases the addition of buffers might cause maxtime failures. Replacing standard threshold voltage ($V_t$) devices with low $V_t$ devices is another known method of improving the characteristics of timing paths. For example, FIG. 1B, labeled prior art, shows a simplified example of some of the issues relating to inserting low $V_t$ devices into an integrated circuit design to address minimum timing issues. However, usage of low $V_t$ devices needs to be minimized to suppress leakage current, and an effective low $V_t$ device replacement algorithm is required.

In integrated circuit design, timing convergence is tedious and prolonged due to the incremental nature of the timing fixes. Because buffers and low $V_t$ devices can address a wide range of timing and electrical issues, many different types of buffers and/or low $V_t$ devices are often used within a single integrated circuit design to address timing issues. A system that automates the process of addressing timing issues of buffers and/or low $V_t$ devices within an integrated circuit design can reduce the design cycle for timing convergence. The algorithm implemented within the system provides a fast and efficient way to resolve timing issues.

SUMMARY OF THE INVENTION

In one embodiment, the invention relates to a method for optimizing the replacement of standard threshold voltage ($V_t$) devices with low $V_t$ devices in an integrated circuit design. The method includes identifying paths and nodes within the integrated circuit design, determining node overlap within the integrated circuit design, calculating possible solutions for addressing timing violations within the integrated circuit design, choosing a solution for addressing timing violations, inserting low $V_t$ devices at particular nodes of the integrated circuit design, and repeating the calculated possible solutions wherein choosing a solution and inserting low $V_t$ devices at particular nodes to address timing violations are within the integrated circuit design. Those who are skilled in the art will understand that low $V_t$ devices exhibit high leakage currents, which may introduce additional constraints on the integrated circuit design and limit the use of low $V_t$ devices for improving timing path characteristics. High leakage currents, along with other constraints (e.g., noise, maxtime convergence, etc.) can introduce challenges in maximizing the number of improved timing paths while minimizing the number of low $V_t$ devices used.

In another embodiment, the invention relates to an apparatus for optimizing the replacement of standard $V_t$ devices with low $V_t$ devices in an integrated circuit design. The apparatus includes means for identifying paths and nodes within the integrated circuit design, means for determining node overlap within the integrated circuit design, means for calculating possible solutions for addressing timing violations within the integrated circuit design, means for choosing a solution for addressing timing violations, means for inserting low $V_t$ devices at particular nodes of the integrated circuit design, and means for repeating the calculated possible solutions. Choosing a solution and inserting the low $V_t$ devices at particular nodes to address timing violations within the integrated circuit design.

In another embodiment, the invention relates to a system for optimizing the replacement of standard $V_t$ devices with low $V_t$ devices in an integrated circuit design. The system includes an identifying module, a determining module, a calculating module, a choosing module, and a repeating module. The identifying module identifies paths and nodes within the integrated circuit design. The determining module determines node overlap within the integrated circuit design. The calculating module calculates possible solutions for addressing timing violations within the integrated circuit design. The choosing module chooses a solution for addressing timing violations. An inserting module inserts low $V_t$ devices at particular nodes of the integrated circuit design. A repeating module repeats the calculated possible solutions. Choosing a solution and inserting low $V_t$ devices at particular nodes to address timing violations within the integrated circuit design.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 2:
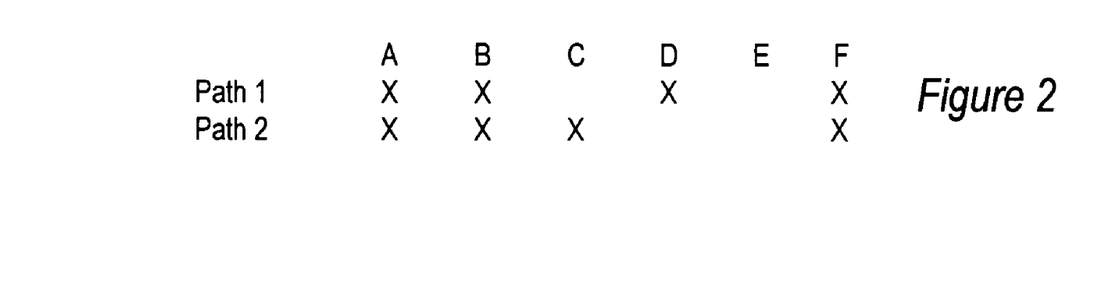
FIG. 2 shows an example of paths and nodes within an integrated circuit design represented in tabular format for ease of understanding.

Referring to FIG. 2, an example of paths and nodes within an integrated circuit design is shown. In this example, each column (e.g., A, B, C, D, E, F) represents a node in the integrated circuit design and each horizontal row (e.g., PATH1, PATH2) represents a path through the integrated circuit design. For this example it is assumed that low $V_t$ devices can be inserted at any node and inserting a low $V_t$ device at any node in the path fixes the minimum timing violation. The criteria to substitute low $V_t$ devices at any node is that the wire delay (RC component) before a device is within predetermined bounds, and there is sufficient mintime slack on each timing path to prevent mintime violation.

The method for optimizing mintime fixes determines any common intersection of the two paths. More specifically, Function F(x) is the final solution and S(pathn) is the solution for path n.

$F(x)=S(path1)$ intersection $S(path2) = A, B, F$

Accordingly, for the example set forth in FIG. 2, a single low $V_t$ device may be inserted at nodes A, B or F to fix the minimum time failure.

Figure 3:
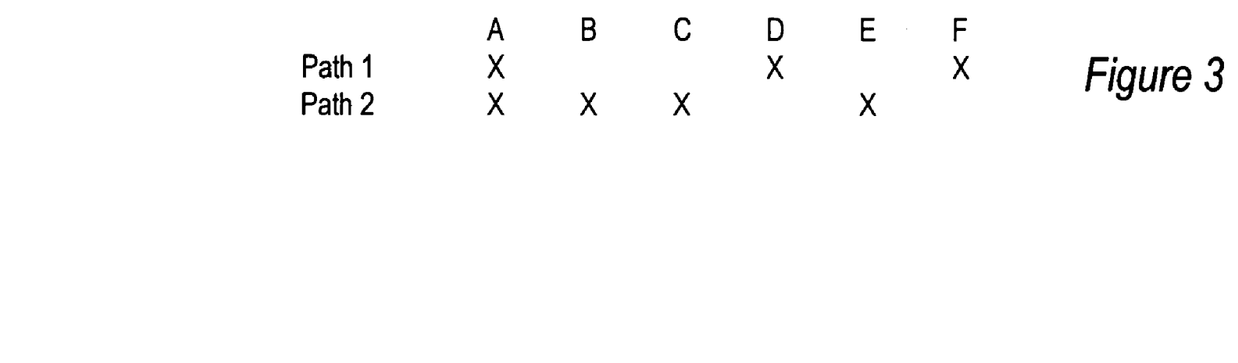
FIG. 3 shows another example of paths and nodes within an integrated circuit design.

Referring to FIG. 3, another example of paths and nodes within an integrated circuit design is shown. In this example, each column (e.g., A, B, C, D, E, F) represents a node in the integrated circuit design and each horizontal row (e.g., PATH1, PATH2) represents a path through the integrated circuit design. For this example it is assumed that low $V_t$ devices can be inserted at any node and inserting a low $V_t$ device at any node in the path fixes the minimum timing violation.

In this example, $F(x) = S(path1)$ intersection $S(path2)$ $= A$.

Accordingly, for the example set forth in FIG. 3 there is a single intersection at which a low $V_t$ device may be inserted to fix the minimum time failure for both paths.

Figure 4:
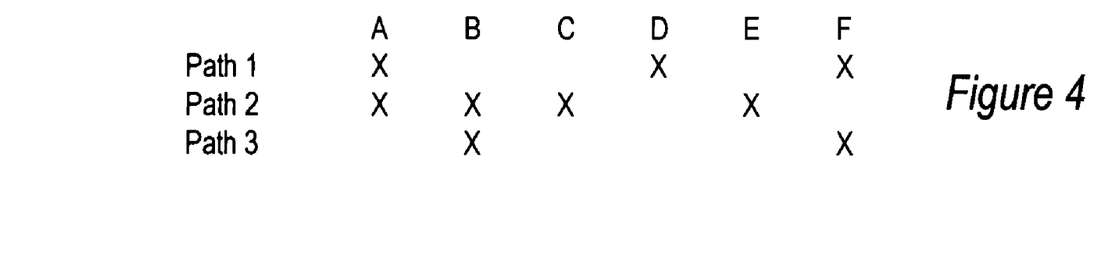
FIG. 4 shows another example of paths and nodes within an integrated circuit design.

Referring to FIG. 4, another example of paths and nodes within an integrated circuit design is shown. In this example, each column (e.g., A, B, C, D, E, F) represents a node in the integrated circuit design and each horizontal row (e.g., PATH1, PATH2, PATH3) represents a path through the integrated circuit design. For this example it is assumed that low $V_t$ devices can be inserted at any node and inserting a low $V_t$ device at any node in the path fixes the minimum timing violation.

In this example, there is no solution in which F(x)=S (path1)intersection S(path2) intersection S(path3). However, there are multiple solutions for addressing sub-combinations of the paths. More specifically, the minimum timing failures of Path1 and Path2 may be fixed by inserting a low $V_t$ device at node A. The minimum timing failures of Path1 and Path3 may be fixed by inserting a low $V_t$ device at node F. The minimum timing failures of Path2 and Path3 may be fixed by inserting a low $V_t$ device at node B. Accordingly, the minimum timing failures of all three paths may be fixed by inserting low $V_t$ devices at either nodes A and F or nodes B and F.

Figure 5:
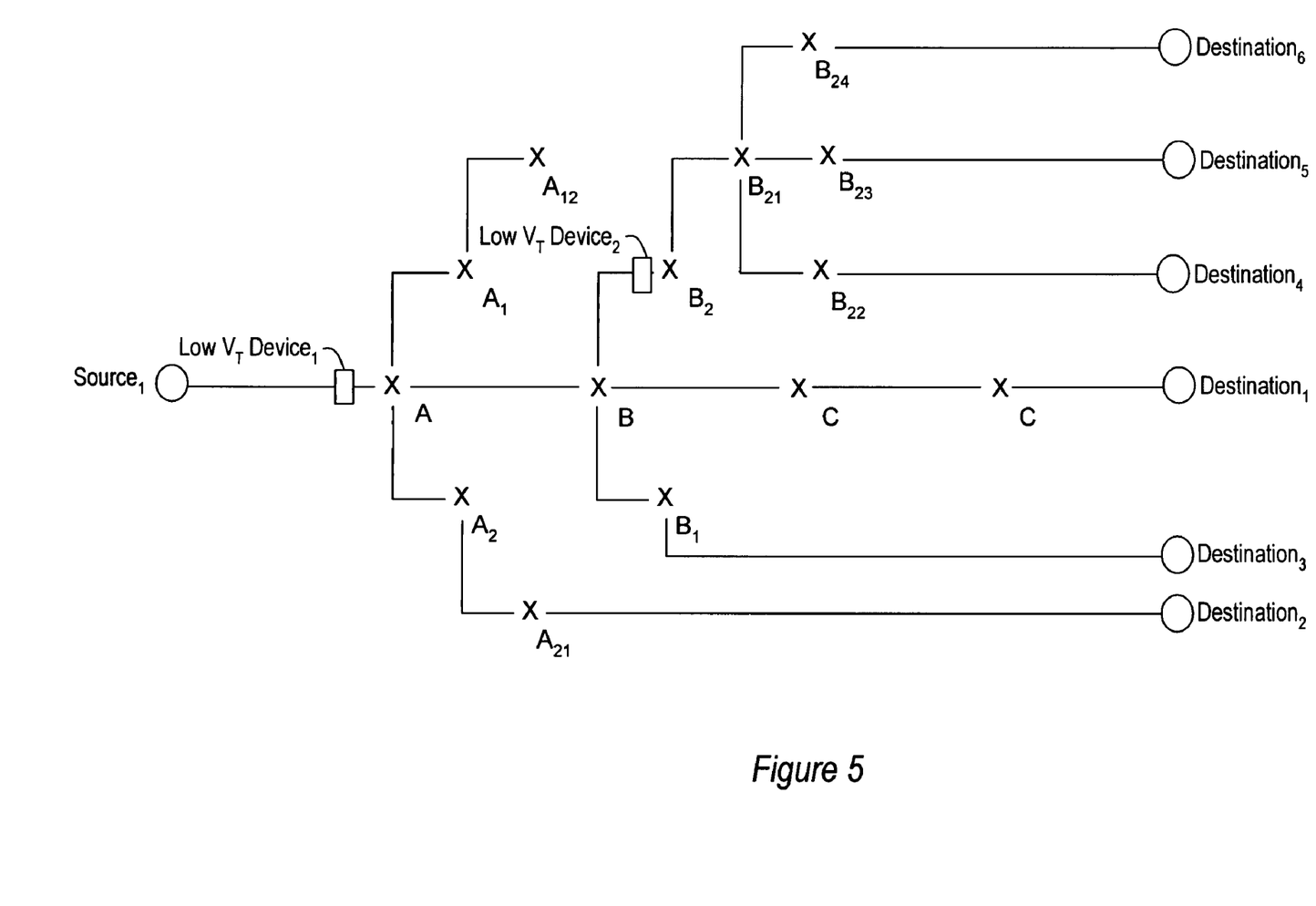
FIG. 5 shows an example of an integrated circuit including low $V_t$ devices for addressing timing failures.

Referring to FIG. 5, an example of an integrated circuit including low $V_t$ devices for addressing timing failures is shown. More specifically, after the system for inserting low $V_t$ devices in an integrated circuit design is executed, it might be determined that inserting low $V_t$ devices at nodes A and B2 fix all minimum timing failures for the exemplative integrated circuit. Additionally, because low $V_t$ device 1 is within the path from source 1 to destinations 4, 5 and 6, the effect of the delay imposed by low $V_t$ device 1 is cumulative to the delay imposed by low $V_t$ device 2. Accordingly, the timing improvement of low $V_t$ device 2 is reduced due to the insertion of low $V_t$ device 1.

Figure 6:
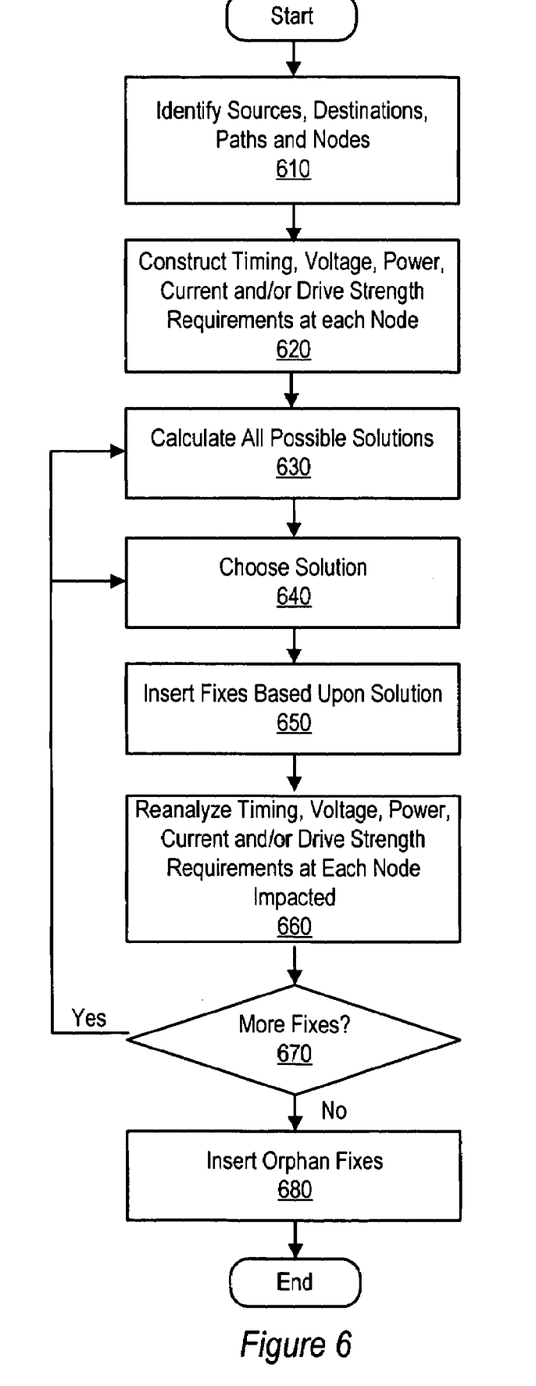
FIG. 6 shows a flow chart of the operation of a method for optimizing integrated circuit design timing fixes.

Referring to FIG. 6, a flow chart of the operation of a method for optimizing integrated circuit design timing fixes is shown. More specifically, when optimizing integrated circuit design timing fixes, the system first identifies sources, destinations, paths and nodes within the integrated circuit design at step 610. Next, the integrated circuit design is analyzed to determine the mintiming and maxtiming criteria, as well as voltage, power, current and/or drive strength requirements at each node and then construct the complete graph of the network at step 620. Next, the system calculates substantially all possible solutions to fix the minimum time failures at step 630. It will be appreciated that "all" possible solutions may be so large a number as to be impractical to calculate. Accordingly, substantially all possible solutions is defined as a plurality of different combinations of solutions that address substantially all of the timing failures.

After the possible solutions are calculated, then a solution is chosen at step 640. The solution is chosen so as to fix a plurality of the timing failures based on various input criteria. At this stage, certain solutions are also further optimized. After the solution is chosen, then the fixes based upon the solution are inserted into the integrated circuit design at step 650. After the fixes are inserted into the integrated circuit design, the timing of the integrated circuit design is reanalyzed at each node impacted by the solution to determine whether there are any additional timing fixes, whether the current solution meets all requirements and whether to perform further optimization of the current fix using the optimization method at step 670. There may be additional timing fixes that are not addressable via the optimization method; these additional timing fixes are referred to as orphan fixes.

If there are additional timing fixes to perform using the optimization method, then the system performs another iteration of the optimization method by returning to step 630. It has been empirically determined that three to four iterations generally addresses most, if not all, of the timing fixes that can be optimized. One way of determining how many iterations to perform is to iterate until the previous maximum number of violations are reached.

If there are not any additional timing fixes to perform using the optimization method, then the system proceeds to insert the orphan fixes at step 680. The execution of the system then completes.

The following example shows the operation of the method. More specifically, consider the example where the possible solutions are:

i) 20 low $V_t$ devices to fix 140 paths.
ii) 25 low $V_t$ devices to fix 125 paths.
iii) 40 low $V_t$ devices to fix 180 paths.
iv) 1 low $V_t$ devices to fix 15 paths.

Figure 7:
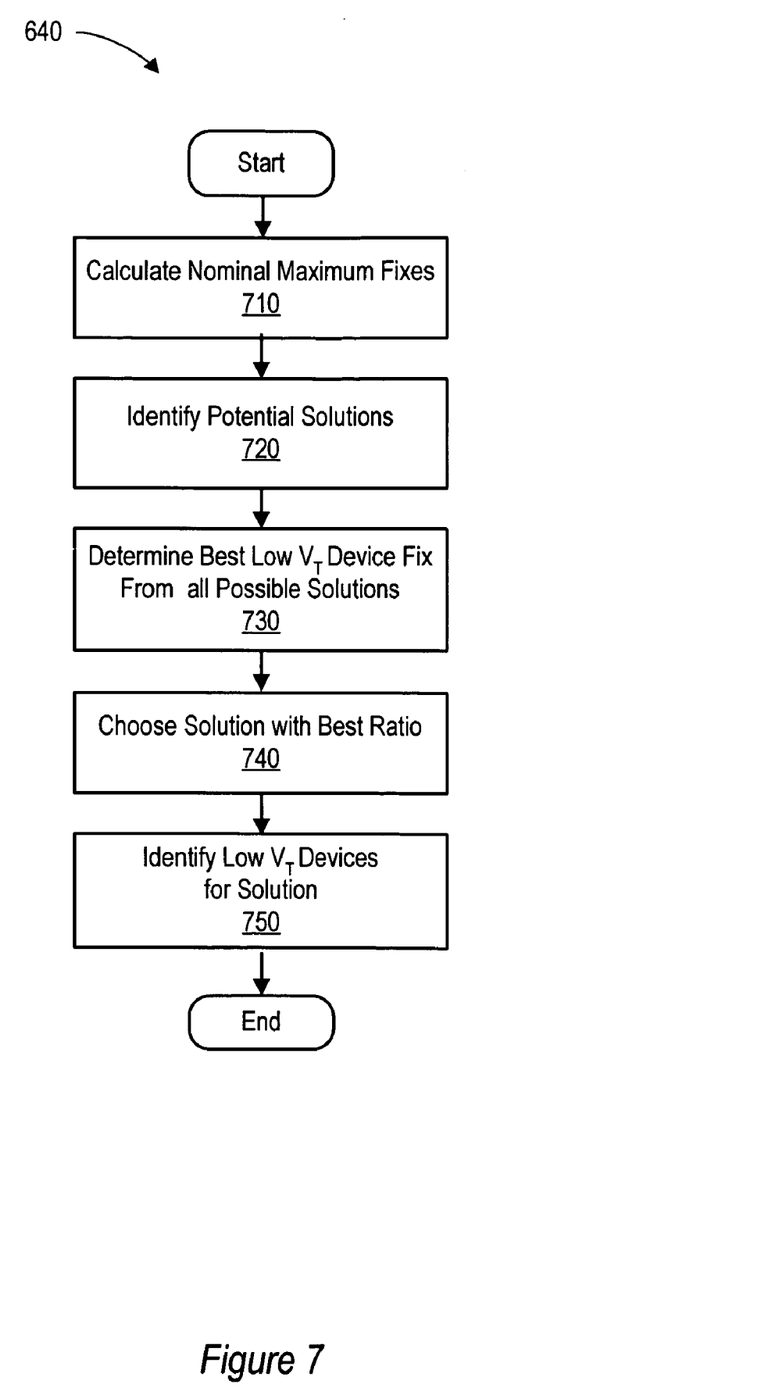
FIG. 7 shows a flow chart of the operation of choosing a solution for optimizing integrated circuit design timing fixes.

FIG. 7 shows a flow chart of the operation of choosing a solution for optimizing integrated circuit design timing fixes via a mean or median approach. More specifically, after the possible solutions are determined, then the system calculates a nominal number of fixes at step 710. This nominal maximum is selected to be the median of all possible solutions. Solutions that fix more than this median are then identified as potential solutions at step 720.

In the example, the nominal maximum=(140+125+180+15)/4=115. Thus, the potential solutions are i, ii and iii.

Next the nominal number of fixes is analyzed to determine the best low $V_t$ device per fix ratio from the possible solution at step 730. In the example, the ideal was solution i which addressed 7 violations (i.e., 140 paths/20 low $V_t$ devices) per device. The solution with the best ratio is selected as the solution at step 740.

Next, low $V_t$ devices are identified for the solution at step 750.

After all the mintime low $V_t$ devices are inserted in the netlist, maxtime is rerun to verify where there are any maxtime violations, and any low $V_t$ devices causing maxtime violation are removed from the netlist to determine the final netlist used in the design.

Figure 8:
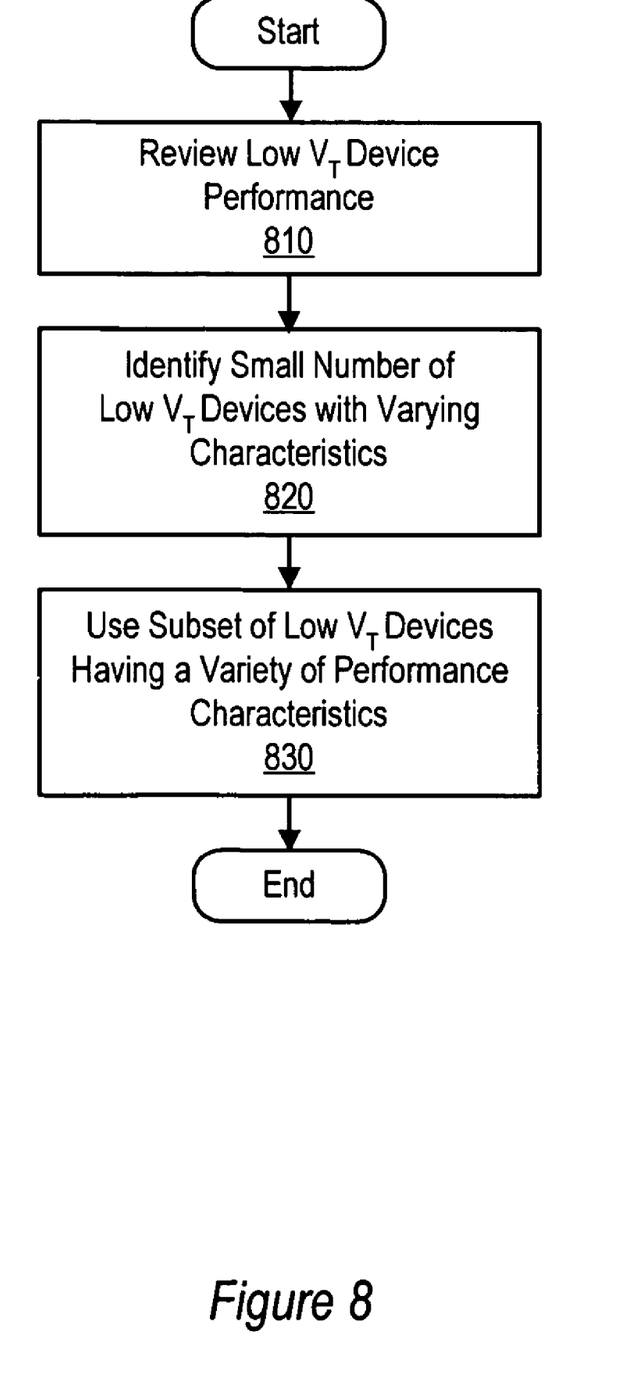
FIG. 8 shows a flow chart of choosing low $V_t$ devices for use in the solution for optimizing integrated circuit design timing fixes.

Referring to FIG. 8, a flow chart of choosing low $V_t$ devices for use in the solution for optimizing integrated circuit design timing fixes is shown. More specifically, the low $V_t$ device performance for all available low $V_t$ devices is reviewed at step 810. From the low $V_t$ device performance review, a smaller number of low $V_t$ devices having varying characteristics are identified at step 820.

When selecting ideal low $V_t$ devices a plurality of criteria are reviewed. For example, standard cell libraries can be searched for low $V_t$ devices that are footprint-compatible with standard $V_t$ devices they would replace. Also, the leakage current of individual low $V_t$ devices can be evaluated, as well as the cumulative leakage current of all low $V_t$ devices, to determine if they are within predetermined limits. Similarly, the RC delay before the device can be checked, to verify if it is within predetermined bounds. Likewise, mintime slacks are checked, which is the difference between the cycle time and the minimum delay time of the low $V_t$ devices. In addition, the low $V_t$ device's drive strength can be checked to determine whether the low $V_t$ device has a desired drive strength.

A simple first order delay calculation may be used to determine the first order delay for the low $V_t$ device at maxtime and mintime corners. More specifically, $$Td=Tintrinsic+Rout(Cload)$$

Td is the timing delay. Tintrinsic is the intrinsic delay of a device. The intrinsic delay is defined as the delay of a device when there is no load connect at the output of the device. The intrinsic delay is calculated from a timing module that is associated with the low $V_t$ device within the low $V_t$ device library.

Rout is the drive strength reflected in terms of resistance units or drive resistance of the device output. Cload is the output capacitance load connected to the device. The Rout is calculated from a timing model that is associated with the low $V_t$ device within the low $V_t$ device library. The loads for the low $V_t$ device are calculated from the timing reports based on actual netlists for the integrated circuit design.

Based on this intrinsic delay at both mintime and maxtime corner. The low $V_t$ device is evaluated.

The mintime slacks can be checked from timing reports, and if the following condition is met:

$$T\text{delay(old\_device)}-T\text{delay(new\_device)}>T\text{slack (min)}$$

The low $V_t$ device can be replaced to correct timing violations or to improve performance.

If this condition is not met, the next low $V_t$ device in the loop can be evaluated. The drive strength of the low $V_t$ device is maintained to be the same as the stage before the low $V_t$ device insertion point. After all low $V_t$ devices are replaced in the netlist, mintime can be rerun to determine whether there are any mintime violations, and any low $V_t$ device causing mintime violation can be removed before finalizing the netlist at step 830. Accordingly, a subset of all low $V_t$ devices available may be used to provide timing fixes to the integrated circuit using the described optimization method. This subset of low $V_t$ devices represents a variety of performance characteristics. For example, low $V_t$ devices with more delay or greater drive strength may be used during the first iteration of the method whereas weaker or faster low $V_t$ devices may be used during follow-on iterations. Thus the timing of the integrated circuit may be optimized using a relatively small number of different low $V_t$ device types.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

For example, another approach for determining a solution for optimizing integrated circuit design timing fixes is via an acquisitive or greedy approach. Using the acquisitive approach, the solution which addresses the greatest number of timing issues is chosen during each iteration of the process. In the above example, the acquisitive approach would select solution iii which would fix the greatest number of violations with a single iteration.

Also, the above-discussed embodiments include software modules that perform certain tasks. The software modules discussed herein may include script, batch, or other executable files. The software modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules is for illustrative purposes. Alternative embodiments may merge the functionality of multiple modules into a single module or may impose an alternate decomposition of functionality of modules. For example, a software module for calling sub-modules may be decomposed so that each sub-module performs its function and passes control directly to another sub-module.

What is claimed is:

1. A method for optimizing low threshold-voltage ($V_t$) devices in an integrated circuit design comprising:
    identifying paths and nodes within the integrated circuit design;
    determining node overlap within the integrated circuit design;
    calculating possible solutions for addressing timing violations within the integrated circuit design;
    choosing a solution for addressing timing violations;
    inserting low $V_t$ devices at one or more overlapping nodes of the integrated circuit design; and,
    repeating the calculating possible solutions, the choosing a solution and the inserting of low $V_t$ devices at particular nodes to address timing violations within the integrated circuit design.

2. The method for optimizing low $V_t$ devices in an integrated circuit design of claim 1 wherein the repeating continues until a previous maximum number of violations have been addressed.

3. The method for optimizing low $V_t$ devices in an integrated circuit design of claim 2 wherein after the repeating, there are timing violations remaining to be addressed; and, further comprising inserting low $V_t$ devices at particular locations to address the timing violations.

4. The method for optimizing low $V_t$ devices in an integrated circuit design of claim 1 wherein the choosing a solution is based upon fixing a plurality of timing violations based upon various input criteria.

5. The method for optimizing low $V_t$ devices in an integrated circuit design of claim 4 wherein the various input criteria include a median approach, the median approach including:
    calculating a nominal number of timing path correction fixes from the calculating of possible solutions, the nominal number of timing path correction fixes being the median of all timing path correction fixes; and
    selecting of one or more of the possible solutions which fixes more than the nominal number of timing path correction fixes.

6. The method for optimizing low $V_t$ devices in an integrated circuit design of claim 4 wherein the various input criteria include an acquisitive approach, the acquisitive approach including determining which solution from the calculating possible solutions fixes a greatest number of timing violations and then selecting the approach which fixes the greatest number of timing violations.

7. The method for optimizing low $V_t$ devices in an integrated circuit design of claim 1 further comprising:
    identifying low $V_t$ devices from a list of potential low $V_t$ devices available to insert into the integrated circuit design; and
    choosing a subset of the low $V_t$ devices from the list as low $V_t$ devices for inserting at the particular nodes of the integrated circuit.

8. The method for optimizing low $V_t$ devices in an integrated circuit design of claim 7 wherein:
    factors used in choosing a subset of the low $V_t$ devices from the list as low $V_t$ devices include a first order delay characteristic of the low $V_t$ devices, a maximum time slack characteristic of the low $V_t$ devices, and a drive strength characteristic of the low $V_t$ devices.

9. A apparatus for optimizing low $V_t$ devices in an integrated circuit design comprising:
    means for identifying paths and nodes within the integrated circuit design;
    means for determining node overlap within the integrated circuit design;
    means for calculating possible solutions for addressing timing violations within the integrated circuit design;
    means for choosing a solution for addressing timing violations;
    means for inserting low $V_t$ devices at one or more overlapping nodes of the integrated circuit design; and,
    means for repeating the calculating possible solutions, the choosing a solution and the inserting low $V_t$ devices at particular nodes to address timing violations within the integrated circuit design.

10. The apparatus for optimizing low $V_t$ devices in an integrated circuit design of claim 9 wherein the repeating continues until a previous maximum number of violations have been addressed.

11. The apparatus for optimizing low $V_t$ devices in an integrated circuit design of claim 10 wherein after the repeating, there are timing violations remaining to be addressed; and, further comprising means for inserting low $V_t$ devices at particular locations to address the timing violations.

12. The apparatus for optimizing low $V_t$ devices in an integrated circuit design of claim 9 wherein the choosing a solution is based upon fixing a plurality of timing violations based upon various input criteria.

13. The apparatus for optimizing low $V_t$ devices in an integrated circuit design of claim 12 wherein the various input criteria include a median approach, the median approach including:
    calculating a nominal number of timing path correction fixes from the calculating of possible solutions, the nominal number of timing path correction fixes being the median of all timing path correction fixes; and
    selecting of one or more of the possible solutions which fixes more than the nominal number of timing path correction fixes.

14. The apparatus for optimizing low $V_t$ devices in an integrated circuit design of claim 12 wherein the various input criteria include an acquisitive approach, the acquisitive approach including determining which solution from the calculating possible solutions fixes a greatest number of timing violations and then selecting the approach which fixes the greatest number of timing violations.

15. The apparatus for optimizing low $V_t$ devices in an integrated circuit design of claim 9 further comprising:
    means for identifying low $V_t$ devices from a list of potential low $V_t$ devices available to insert into the integrated circuit design; and means for choosing a subset of the low $V_t$ devices from the list as low $V_t$ devices for inserting at the particular nodes of the integrated circuit.

16. The apparatus for optimizing low $V_t$ devices in an integrated circuit design of claim 15 wherein:
   factors used in choosing a subset of the low $V_t$ devices from the list as low $V_t$ devices include a first order delay characteristic of the low $V_t$ devices, a maximum time slack characteristic of the low $V_t$ devices, and a drive strength characteristic of the low $V_t$ devices.

17. A system for optimizing low $V_t$ devices in an integrated circuit design comprising:
   an identifying module, the identifying module identifying paths and nodes within the integrated circuit design;
   a determining module, the determining module determining node overlap within the integrated circuit design;
   a calculating module, the calculating module calculating possible solutions for addressing timing violations within the integrated circuit design;
   a choosing module, the choosing module choosing a solution for addressing timing violations; an inserting module, the inserting module inserting low $V_t$ devices at one or more overlapping nodes of the integrated circuit design; and,
   a repeating module, the repeating module repeating the calculating possible solutions, the choosing a solution and the inserting low $V_t$ devices at particular nodes to address timing violations within the integrated circuit design.

18. The system for optimizing low $V_t$ devices in an integrated circuit design of claim 17 wherein the repeating continues until a previous maximum number of violations have been addressed.

19. The system for optimizing low $V_t$ devices in an integrated circuit design of claim 18 wherein after the repeating, there are orphan timing violations remaining to be addressed; and, further comprising an orphan inserting module, the orphan inserting module inserting low $V_t$ devices at particular locations to address the orphan timing violations.

20. The system for optimizing low $V_t$ devices in an integrated circuit design of claim 18 wherein the choosing a solution is based upon fixing a plurality of timing violations based upon various input criteria.

21. The system for optimizing low $V_t$ devices in an integrated circuit design of claim 20 wherein the various input criteria include a median approach, the median approach including:
   calculating a nominal number of timing path correction fixes from the calculating of possible solutions, the nominal number of timing path correction fixes being the median of all timing path correction fixes; and
   selecting of one or more of the possible solutions which fixes more than the nominal number of timing path correction fixes.

22. The system for optimizing low $V_t$ devices in an integrated circuit design of claim 20 wherein the various input criteria include an acquisitive approach, the acquisitive approach including determining which solution from the calculating possible solutions fixes a greatest number of timing violations and then selecting the approach which fixes the greatest number of timing violations.

23. The system for optimizing low $V_t$ devices in an integrated circuit design of claim 17 further comprising:
   an identifying module, the identifying module identifying low $V_t$ devices from a list of potential low $V_t$ devices available to insert into the integrated circuit design; and
   a subset choosing module, the subset choosing module choosing a subset of the low $V_t$ devices from the list as low $V_t$ devices for inserting at the particular nodes of the integrated circuit.

24. The system for optimizing low $V_t$ devices in an integrated circuit design of claim 23 wherein:
   factors used in choosing a subset of the low devices from the list as low $V_t$ devices include a first order delay characteristic of the low $V_t$ devices, a maximum time slack characteristic of the low $V_t$ devices, and a drive strength characteristic of the low $V_t$ devices.

* * * * *